WAFER MOUNTED COMPONENT CAPABLE OF ELECTRICAL ADJUSTMENT

Filed May 23, 1961

INVENTOR.
Charles C. Rayburn
BY Robert K. Sch...
ATT'Y.

United States Patent Office 3,202,952
Patented Aug. 24, 1965

3,202,952

WAFER MOUNTED COMPONENT CAPABLE OF ELECTRICAL ADJUSTMENT

Charles C. Rayburn, Alexandria, Va., assignor to Illinois Tool Works Inc., a corporation of Delaware Filed May 23, 1961, Ser. No. 111,950
4 Claims. (Cl. 338—195)

The present invention relates in general to novel electronic components, and more particularly, to a wafer mounted electronic component of the type having at least a portion thereof capable of being removed for adjusting the characteristics thereof.

This invention relates to the mass production of electronic devices and in particular relates to modular type electronic components. The growing complexity of the electronic art has lead to automated production lines. Starting from raw or semi-processed materials, machines automatically manufacture and fire ceramic materials such as steatite into wafers, manufacture adhesive carbon resistors, print conducting circuits on the wafers, and mount resistors, capacitors and other electronic component parts on the standard uniform steatite wafers. The wafers are then stacked and soldered on riser wires very much like building blocks to form a module that performs all the functions of one or more electronic stages.

The wafer elements per se are generally flat, square and substantially uniform in peripheral dimensions and thickness. The marginal edges of the individual wafers are provided with a plurality of V-shaped notches which are generally equally spaced, there being some orientation means on the wafer to afford location thereof for automatic handling.

The method of making the wafers, mounting various printed circuitries thereon, and the addition of various components to the wafers by automatic machinery is well understood. One trouble spot in the automatic process has been non-uniformity of components for mounting on the steatite wafers. For example, carbon tape resistors which are mounted on the wafer have presented a problem in adjustment of the electrical characteristics thereof once they have been mounted in place. This is true of other types of thin film electronic components such as certain capacitors and other types of resistors.

In normal practice the wafers are first produced and fired in a suitable furnace whereupon they are moved by automatic machinery to a station which prints the printed circuitry thereon. This printed circuitry or metallized coating which is screened on the wafer is then in turn fired to cause a good adherence of the material to the wafer. After this second firing, tape type resistors are cut from a roll by automatic machinery and through a pressure sensitive means are caused to adhere to the wafer in contact with two spaced portions of a printed circuit on the wafer. The adhesive on the tape holds the resistor in place temporarily and then the wafers are conveyed to a suitable press which firmly presses the resistors to the wafer and then the resistors and wafers are fired to bake and cure the resistor tapes on to the surface. Then the process requires a testing of the resistors which sorts the so-called "good" wafers from those with ohmic values of the resistors which are not in the electrical tolerance range desired. Heretofore, there has been a severe problem as to making adjustments in the values of those resistors which are not within the correct electrical tolerance. It is this problem and with analogous problems with other types of film like electrical components which are mounted on a wafer that this invention is concerned.

It is an object of the present invention to provide a wafer mounted electronic component of the type having at least a portion thereof capable of being removed for adjusting the characteristics thereof.

It is a further object of the present invention to provide a wafer mounted component wherein discrete portions of the component are removed to obtain the desired electrical characteristics of the component.

Still another object of this invention is to provide a novel wafer having a preselected pattern of depressions therein which greatly facilitate the adjustment of electronic components thereon by automatic machinery.

The novel features that are characteristic of the invention are set forth with particularity in the appended claims. The invention itself, however, both as to its organization and its mode of operation, together with additional objects and advantages thereof will best be understood by the following description of specific embodiments when read in conjunction with the accompanying drawings in which:

Figures 1, 2, 3, 4, 5, 6:
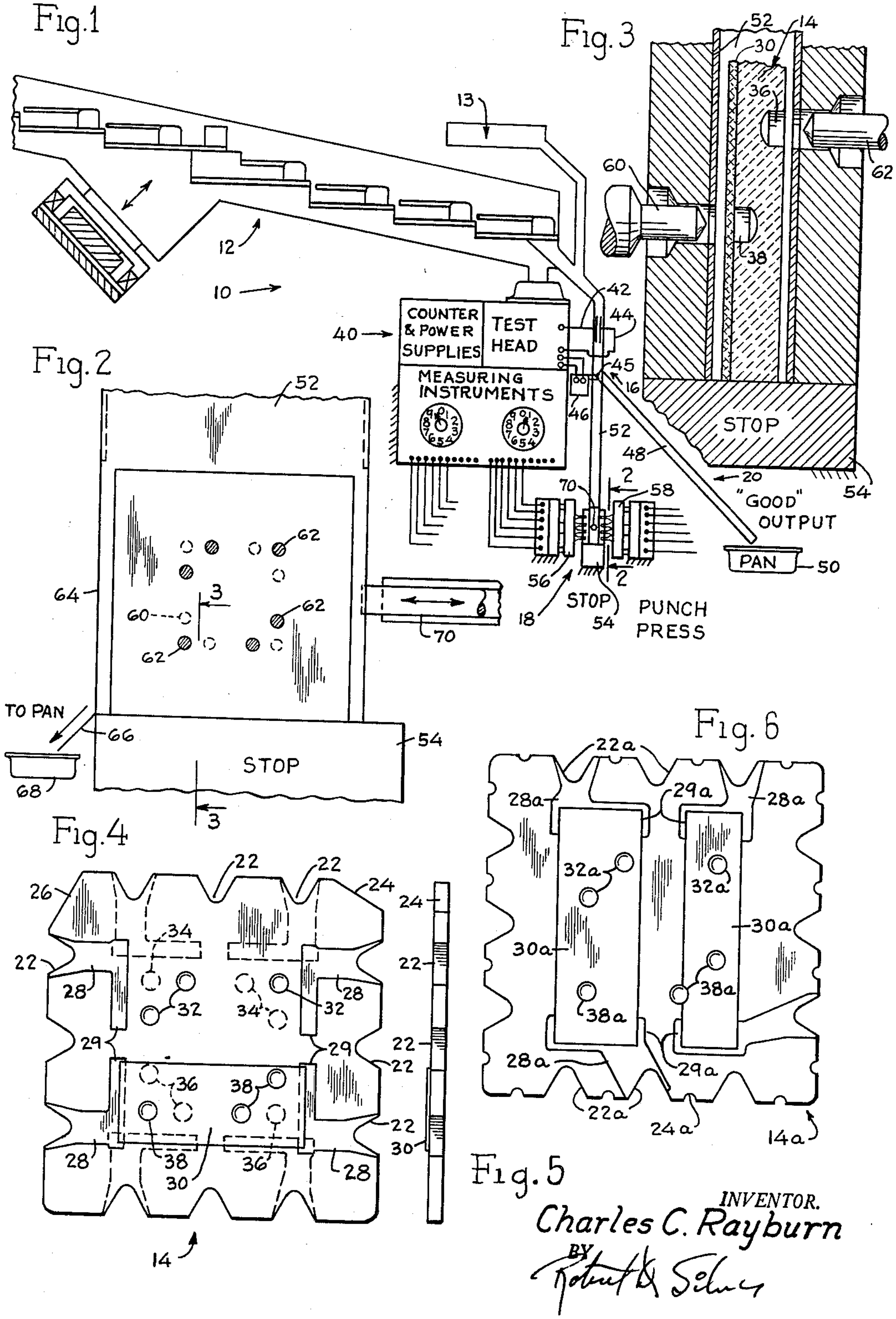
FIG. 1 is a semi-diagrammatic view showing apparatus for orienting, testing, sorting, and adjusting wafers having electrical components thereon of the types shown in FIGS. 4 through 6.
FIG. 2 is a sectional view along lines 2—2 of FIG. 1.
FIG. 3 is an enlarged fragmentary sectional view along lines 3—3 of FIG. 2.
FIG. 4 is a plan view of one type of wafer well adapted to be handled by the method and apparatus set forth in FIGS. 1 through 3, said wafer having a pattern of depressions formed therein.
FIG. 5 is a side elevational view of the wafer shown in FIG. 4.
FIG. 6 is a plan view of an alternate type of wafer illustrating not only a different type of wafer but a different orientation of the taped component thereon which is usable in the method and apparatus shown in FIGS. 1 through 3.

The apparatus 10 for orienting, feeding, testing, sorting, and adjusting wafers 14 comprises alternate feeder portions 12 or 13, a testing sorting means 16, an adjusting means 18 for out of tolerance wafers and an output means 20 for the "good" wafers that are in electrical tolerance. The orienting feeder 12 is a diagrammatic representation of the orienting feeder shown in United States patent application Serial No. 71,302 filed November 23, 1960, now patent No. 3,078,335, and assigned to the same assignee. The alternate input feeding mechanism 13 (shown diagrammatically) feeds wafers which are preoriented to the test and sorting station 16.

The wafer 14 is of the general type shown in the aforementioned patent application and is generally square, flat, relatively thin, and made of steatite. The wafer 14 has a plurality of peripheral solder receiving notches 22 located in the side margins of the wafer as shown for attachment to riser wires. Orienting means 24 and 26 for the wafer 14 afford automatic orientation thereof in any one of eight preselected positions as suitable and desired. Printed circuitry 28 may be patterned upon the wafer 14 to provide spaced terminal areas 29 for various electrical components such as 30 which are mounted thereon for connection to the solder receiving notches 22 as shown in FIGS. 4 and 6. An alternate position of printed circuitry on the wafer is shown on the reverse side of the wafer in dotted lines in FIG. 4. It will be appreciated that both sides of the wafer may be the same or different and the dotted circuitry shows how connections may be made when it is desired to connect the components such as 30 in vertical position rather than in the horizontal position shown. Of course, any number of other configurations of printed circuitry are available depending upon the design characteristics required for a particular application. Further, more than two resistor tapes may be mounted on one side.

In the manufacture of the wafer 14, the wafers are formed with a plurality of shallow depressions 32, 34, 36, 38 on opposite sides thereof which may be in the pattern shown in FIG. 4. These somewhat cup-shaped depressions may be of any desired number and any desired size and configuration, but as here shown, are preferably arranged in mirror image relationship from both front to rear considerations and from top to bottom considerations. More particularly as shown in FIG. 4, the depressions 32 are in mirror image relationship with the depressions 34 on the reverse side of the wafer. Also, the depressions 32–34 are in mirror image relationship to the depressions 36–48 on the lower half of the wafer. A number of advantages accrue to having a symmetrical mirror image relationship as just discussed which will become apparent hereinafter. It will be noted that the depressions 32–38 are located inboard of the terminal areas 29.

The electrical component 30 on wafer 14 may take the form of a carbon tape type of resistor which is mounted to two spaced terminals 29 of the printed circuitry 28 and transverse the depressions 38. Only one resistor 30 is shown for illustrative reasons. The resistors 30, after they have been mounted and cured by being fired in an oven, are generally of a brittle-like nature and strongly adhere to the wafer. This is true of various other types of electrical components such as certain capacitors and other types of resistors which are of a film-like nature.

Returning now to the apparatus in FIG. 1, it will be seen that as the wafers with the carbon tape resistors 30 mounted thereon pass through the testing head 16, their electrical characteristics are tested by appropriate members attached to suitable electrical leads such as 42 and 44. It will be appreciated that the testing head 16 per se connects to all twelve solder receiving notches 22 of the wafer 14 and leads 42 and 44 are diagrammatic representative of the electrical connections to the control panel. The test head 16 actuates a gate 45 through a mechanism 46 (shown diagrammatically) so as to sort the wafers into two classes. Class I, the "good" wafers having correct ohmic values of resistors are guided to the "good" output 20 down the chute 48 into the pan 50. Class II, the out of tolerance resistors, will be sorted and sent by gate 45 down chute 52. The wafers 14 as they come down chute 52, are stopped by a suitable stop means 54. Two punch heads 56 and 58 are aligned on opposite sides of the wafer located on stop 54, there being one set of individual punches such as 60, for each depression on one side of the wafer and another set of individual punches 62 for the depressions on the other side of the wafer. These sets of punches 60 and 62 are independently actuated by controls on the control panel 40.

The control panel 40 sequentially actuates the individual punches as determined by the programs of the test head and counter mechanism. The preferred mode of operation of the apparatus 10 is to run through a batch of wafers 14 and all wafers that are sorted so as to go down chute 52 are subjected to one punch on a resistor that is out of tolerance. This removes an area of the resistor the size of the punch which changes the ohmic value of the resistor. The wafers are then returned to input feed 13 and are run through the test head station at 16 again and those wafers that go down chute 52 a second time have the resistors 30 punched with a second and different punch. This operation continues for as many punches available per resistor 30 and until all wafers have been run through the test head and all wafers are in the "good" output pan 50.

It is important to note that to get best effects from this system, all carbon tape resistors 30 should be initially cut from a supply roll and placed on the wafers such that their ohmic resistance is never lower than the electrical tolerance level desired. This obtains since this adjustment operation is basically one of removal of a portion of the resistor. As the individual punches are actuated against the tape 30 from the position such as shown in FIG. 3, the carbon tape resistor 30 is punctured by the punch and the tape material is sheared around the edge of the depression. The removed portion of the tape which is brittle and dry, crumbles and falls out of the depression 38. An actuator 70 then removes the individual wafers from adjacent the stop 54 so as to leave an opening 64 in the chute 52 and fall down a chute 66 into an output pan 68 (which may be in the form of an oriented rack).

It will be appreciated that by the pattern of depression and punches shown, it makes no difference whether or not the carbon tapes 30 are aligned in vertical or horizontal position and the controls are usually set so as to actuate any desired number of punches in an individual tape 30 mounted on a wafer. As shown in the drawings, there are only three punches possible in each individual tape whether it be horizontally or vertically aligned, however, this can be varied at will by merely placing more depressions and punches in the wafer and punch press heads respectively.

It will be further appreciated that the configuration of the particular depressions in the wafer and the configuration of the punches may be varied within wide limits and it is specifically contemplated that various sizes of punches can be used if desired. However, due to the nature of the wafers, it is preferred that the punches be symmetrically arranged so that several orientations of the tape may be utilized with a single punching head.

The wafer shown in FIG. 6 is quite similar to that shown in FIG. 4, and similar parts will be similarly identified with reference numerals utilizing the suffix "*a*." The wafer 14*a* is substantially similar to that shown in FIG. 4 except that it is of the type that is generally made in a larger size. The location of the two carbon tape resistors 30*a* on the wafer 14*a* illustrate a vertical alignment of resistors (as compared with wafer 14). The holes 32*a* and 38*a* have been punched in the tapes 30*a* in alignment with the depressions in the wafer 14*a* in a pattern similar to that shown in FIG. 14.

It will be realized that there are many other types of wafers which are suitable for the purposes aforedescribed. From the foregoing description it will be apparent that the wafer hereinbefore described is particularly well adapted for providing good efficient adjustment of the electrical characteristics of a film-type electronic component mounted on a wafer in a fast, trouble free, repetitive manner.

Although specific embodiments have been shown and described, it is with full awareness that many modifications thereof are possible. The invention, therefore, is not to be restricted except insofar as is necessitated by the prior art and by the spirit of the appended claims.

What is claimed as the invention is:

1. A wafer made of insulating material and having at least one electronic component mounted thereon of the type having at least a portion thereof capable of being removed for adjusting the characteristics thereof, said wafer comprising a polygonally shaped relatively thin body having planar surfaces bounded by a periodically interrupted margin, a plurality of depressions extending partially through the wafer on at least one of said planar surfaces and occupying only a small portion of the total surface area thereof, said electronic component being fixedly mounted on said wafer with at least the removable portion thereof disposed in overlying, spaced relationship to the bottom surface of at least one of said depressions whereby mechanical means may be aligned with at least said one depression for separating the removable portion from said electronic component for changing the electrical characteristics thereof, and conductive means extending from said component to the periodically interrupted margin of said wafer.

2. The wafer set forth in claim 1 including means provided on the wafer to orient it in a predetermined position.

3. The wafer set forth in claim 1 wherein the periodic interruptions are solder receiving notches and the depressions are spaced inwardly of said notches.

4. A polygonal wafer composed of insulating material characterized as having a generally square configuration, each of the side edges of said wafer having a plurality of shallow-solder receiving notches in spaced relation therealong, at least two printed circuit means on at least one of the plane surfaces of the wafer spacedly disposed relative to each other and each separately extending to at least one different solder receiving notch, at least one shallow depression formed in said one plane surface in the area between said two spaced printed circuit means, substantially flat brittle electrical resistance means of the type having at least a portion thereof capable of being removed for adjusting its characteristics being electrically connected to each of said spaced printed circuit means, said electrical resistance means being mounted on said one plane surface with the removable portion thereof in spaced, overlying relationship to the bottom wall of at least said one depression whereby mechanical means may be aligned with said depression for puncturing said resistance means to remove the portion thereof overlying said depression to thereby change its electrical characteristics.

References Cited by the Examiner

UNITED STATES PATENTS

| | | | |
|---|---|---|---|
| 1,422,130 | 7/22 | Reynolds | 338—308 |
| 2,382,024 | 8/45 | Priessman | 338—195 |
| 2,400,404 | 5/46 | Fruth | 29—155.7 |
| 2,474,988 | 7/49 | Sargrove | 317—101 |
| 2,598,155 | 5/52 | Betts | 338—350 |
| 2,629,166 | 2/53 | Marsten et al. | 338—309 |
| 2,726,306 | 12/55 | Ferguson | 338—308 |
| 2,775,673 | 12/56 | Johnson | 338—333 |
| 2,777,039 | 1/57 | Thias | 338—309 |
| 2,792,620 | 5/57 | Kohring | 29—155.7 |
| 2,848,359 | 8/58 | Talmey | 338—309 |
| 2,876,392 | 5/59 | Sanders | 338—308 X |
| 2,912,745 | 11/59 | Steigerwalt et al. | 317—101 X |
| 2,912,746 | 11/59 | Oshry et al. | 317—101 X |

RICHARD M. WOOD, *Primary Examiner.*

ANTHONY BARTIS, RAY K. WINDHAM, *Examiners.*